(12) United States Patent
Romanow et al.

(10) Patent No.: US 11,249,128 B2
(45) Date of Patent: *Feb. 15, 2022

(54) AIRBORNE ANTENNA GROUND PROJECTION

(71) Applicant: SR Technologies, Inc., Davie, FL (US)

(72) Inventors: Steven M. Romanow, North Lauderdale, FL (US); Mark Passler, Boca Raton, FL (US); Graham K. Smith, Boca Raton, FL (US)

(73) Assignee: SR Technologies, Inc., Sunrise, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/069,383

(22) Filed: Oct. 13, 2020

(65) Prior Publication Data
US 2021/0025930 A1  Jan. 28, 2021

Related U.S. Application Data

(63) Continuation of application No. 16/358,045, filed on Mar. 19, 2019, now Pat. No. 10,845,403.

(60) Provisional application No. 62/645,291, filed on Mar. 20, 2018.

(51) Int. Cl.
*G01R 29/10* (2006.01)
*H04B 7/185* (2006.01)

(52) U.S. Cl.
CPC ......... *G01R 29/10* (2013.01); *H04B 7/18502* (2013.01)

(58) Field of Classification Search
CPC .......................... G01R 29/10; H04B 7/18502
See application file for complete search history.

(56) References Cited

U.S. PATENT DOCUMENTS 8,717,226 B2  5/2014  Bon et al.

FOREIGN PATENT DOCUMENTS

CN  103022696 B  *  6/2015  ............... H01Q 3/08

* cited by examiner

*Primary Examiner* — Hoang V Nguyen
(74) *Attorney, Agent, or Firm* — Christopher & Weisberg, P.A.

(57) ABSTRACT

A method and computer for determining a ground coverage footprint of a beam of an antenna mounted above the ground are disclosed. A method includes determining the far projection distance based at least in part on beam width and tilt angle, the far projection distance being a lesser of: a first distance from the antenna to the ground of a 3 dB far projection; two times a second distance from the antenna to the ground of a 3 dB near projection; and a third distance from the antenna to the ground of a projection of the maximum antenna gain multiplied by the square root of two. A ground footprint of the beam is determined based at least in part on the determined far projection distance. The method further includes causing the antenna to be pointed based at least in part on the determined ground footprint of the beam of the antenna.

20 Claims, 13 Drawing Sheets

FIG. 9                                                                                          800

| BW/2 Φ degrees | Pitch, θ, degrees | | | | | | | | | | | | | | | | | | |
|---|---|---|---|---|---|---|---|---|---|---|---|---|---|---|---|---|---|---|---|
| | 0 | 5 | 10 | 15 | 20 | 25 | 30 | 35 | 40 | 45 | 50 | 55 | 60 | 65 | 70 | 75 | 80 | 85 | 90 |
| 10 | 5 | 7.4 | 9.8 | 12.2 | 14.5 | 17.4 | 20.7 | 25 | 30 | 35 | 40 | 45 | 50 | 55 | 60 | 65 | 70 | 75 | 80 |
| 20 | 9.8 | 12.2 | 14.5 | 16.7 | 18.7 | 20.7 | 22.5 | 24.2 | 27 | 30 | 32.8 | 35.4 | 40 | 45 | 50 | 55 | 60 | 65 | 70 |
| 25 | 12.2 | 14.5 | 16.7 | 18.7 | 20.7 | 22.5 | 24.2 | 25.7 | 27 | 30 | 32.8 | 35.4 | 37.8 | 40 | 45 | 50 | 55 | 60 | 65 |
| 30 | 14.5 | 16.7 | 18.7 | 20.7 | 22.5 | 24.2 | 25.7 | 26.9 | 28 | 30 | 32.8 | 35.4 | 37.8 | 39.9 | 41.6 | 45 | 50 | 55 | 60 |
| 35 | 16.7 | 18.7 | 20.7 | 22.5 | 24.2 | 25.7 | 26.9 | 28 | 28.9 | 30 | 32.8 | 36.4 | 27.8 | 39.9 | 41.6 | 43.1 | 45 | 50 | 55 |
| 40 | 18.7 | 20.7 | 22.5 | 24.2 | 25.7 | 26.9 | 28 | 28.9 | 29.5 | 30 | 32.8 | 35.4 | 37.8 | 39.9 | 41.6 | 43.1 | 44.1 | 45 | 50 |
| 45 | 20.7 | 22.5 | 24.2 | 25.7 | 26.9 | 28 | 28.9 | 29.5 | 29.9 | 30 | 32.8 | 35.4 | 37.8 | 39.9 | 41.6 | 43.1 | 44.1 | 44.8 | 45 |

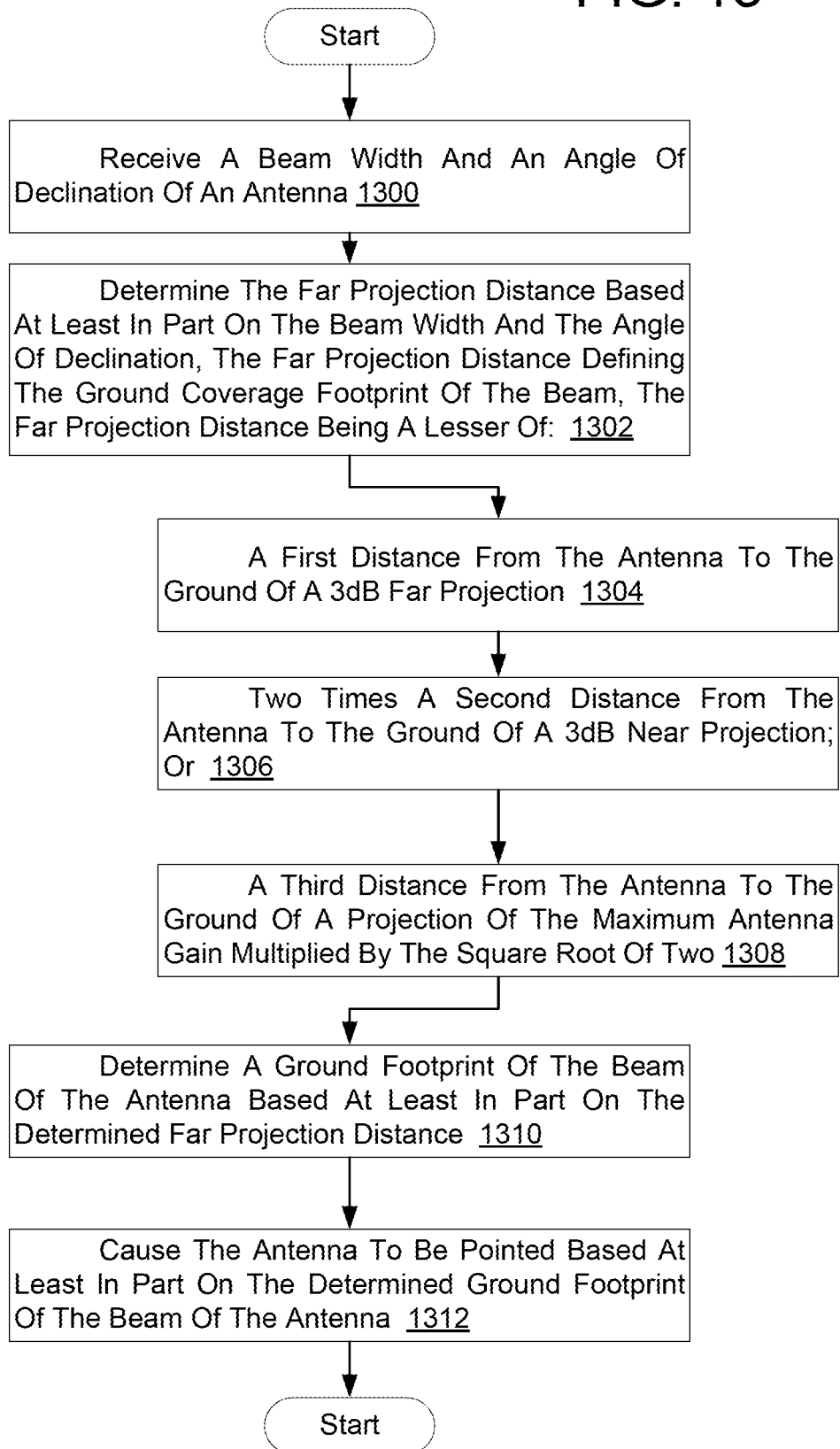

AIRBORNE ANTENNA GROUND PROJECTION

CROSS-REFERENCE TO RELATED APPLICATION

This Application is based on and claims priority to U.S. Utility patent application Ser. No. 16/358,045, entitled "AIRBORNE ANTENNA GROUND PROJECTION," filed Mar. 19, 2019, which claims priority to U.S. Provisional Patent Application No. 62/645,291, entitled "AIRBORNE ANTENNA GROUND PROJECTION," filed Mar. 20, 2018, the entire contents of both of which are incorporated herein by reference.

STATEMENT REGARDING FEDERALLY SPONSORED RESEARCH OR DEVELOPMENT

N/A.

FIELD

This disclosure relates to projection for the ground coverage of an airborne directional antenna.

BACKGROUND

A directional antenna is an antenna which radiates or receives greater power in specific directions as compared to other directions and typically defines the antenna beam width as the angle subtended by the directions where the antenna gain is −3 dB compared to the maximum gain. A directional antenna will have a beam width in the horizontal and the vertical planes. When a directional antenna is positioned at a height above the ground, in an aircraft for example, and the antenna is generally pointed towards the ground, it is beneficial to show the antenna coverage superimposed on a display of the ground map.

FIG. 1 is an exemplary plot of the gain of a typical directional antenna. The antenna vertical gain plot 10 is displayed in dBs against direction. The plot is shown in polar form with the direction angle 20 and the gain axis 30. In this example, the maximum gain of the antenna along the gain axis 30 is shown at the direction 90 degrees. In this example, at about 110 degrees 40, the gain is at −3 db compared to the maximum gain along the gain axis 30 at 90 degrees. Similarly, at about 70 degrees 50, the gain is also at −3 db compared to the maximum gain along the gain axis 30 at 90 degrees. Hence, the vertical beam width for this example antenna is about 40 degrees.

FIG. 2 is a diagrammatical representation of a directional antenna 100 positioned above the earth's surface showing the effective antenna projection 140 on the earth's surface. The directional antenna 100 is positioned at a tilt angle $\theta_1$ 105 and the projection 110 represents the direction of maximum antenna gain at the tilt angle $\theta_1$ 105. The tilt angle is also referred to herein as the angle of declination. Assuming the directional antenna 100 has a vertical beam width of 2Φ, 106 and 107, then projection 120 representing a −3 dB gain, is at a tilt angle of ($\theta_1$−Φ) and projection 130, representing the other −3 dB gain, is at a tilt angle of ($\theta_1$+Φ) where projections 120 and 130 represent the 3 dB beam width.

For clarity, in this disclosure, the −3 dB projection nearest to the position on the ground immediately below the airborne antenna will be referred to as the "−3 dB near projection" and the −3 dB projection farthest to the position on the ground immediately below the airborne antenna will be referred to as the "−3 dB far projection". In FIG. 2, projection 130 is the −3 dB near projection and projection 120 is the −3 dB far projection.

FIG. 3 is a diagrammatical representation of a directional antenna 100 positioned above the earth's surface at a tilt angle $\theta_2$ 205 where $\theta_2$ 205 is a smaller angle than $\theta_1$ 105 shown in FIG. 1. Directional antenna 100 has a beam width of 2Φ, 106 and 107. Maximum gain projection 210 represents the direction of maximum antenna gain at the tilt angle $\theta_2$ 205 and projections 220 and 230 represent the −3 dB far and near projections at tilt angles of ($\theta_2$−Φ) and ($\theta_2$+Φ) respectively. Note that in this example the distance on the ground 242 between the maximum gain projection 210 and the −3 dB far projection 220 is greater than the distance on the ground 241 between the maximum gain projection 210 and −3 dB near projection 230.

As the tilt angle θ becomes smaller, the distance to the −3 dB far projection 220 will progressively become larger and larger compared to the distance to the −3 dB near projection 230.

FIG. 4 is a diagrammatical representation of a directional antenna 100 positioned above the earth's surface at a tilt angle $\theta_3$ 305 where $\theta_3$ 305 approaches the value of half the beam width, Φ, the −3 dB far projection 320, at angle ($\theta_3$−Φ), approaches a horizontal path and hence, the ground distance 342 between the maximum antenna gain projection 310 and the −3 dB far projection 320 becomes extremely large and, in the case that $\theta_3$=Φ, infinite. Hence, as the tilt angle value θ approaches the value of half the beam width, Φ, the projection of the antenna coverage on the ground would be extremely long and impractical. However, the distance on the ground 341 between the maximum antenna gain projection 310 and the −3 dB near projection 330 at angle ($\theta_3$+Φ) is practical and useful.

Hence, simply using the two −3 dB projections to display the antenna ground coverage can result in extremely large footprints on the ground as the value of the tilt angle approaches that of half the beam width. Such projections have little if no real value.

SUMMARY

Methods and computers for determining a ground coverage footprint of a beam of an antenna mounted above the ground and projecting the beam downward toward the ground at an angle of declination are provided. A far projection distance is determined that results in a practical ground footprint of the beam.

According to one aspect, a method includes determining the far projection distance based at least in part on a width of the beam and the angle of declination, the far projection distance being a lesser of: a first distance from the antenna to the ground of a 3 dB far projection; two times a second distance from the antenna to the ground of a 3 dB near projection; and a third distance from the antenna to the ground of a projection of the maximum antenna gain multiplied by the square root of two. Once the far projection distance is determined, a ground footprint of the beam of the antenna is determined based at least in part on the determined far projection distance. The method further includes causing the antenna to be pointed based at least in part on the determined ground footprint of the beam of the antenna.

According to this aspect, in some embodiments, the far projection distance corresponds to a far projection angle that is based at least in part on the beam width and the angle of declination of the antenna. In some embodiments, the first distance is given by $$Rf = \frac{A}{\sin(\theta - \Phi)};$$

where A is a height of the antenna above the ground, θ is the angle of declination, and φ is an angle between the projection of the maximum antenna gain and the −3 dB near projection. In some embodiments, an angle, α, of the far projection distance is based at least in part on at least one of the angle of declination, θ, and the angle φ. In some embodiments, the angle α is selected from a lookup table based at least in part on at least the angle of declination, θ, and the beam width. In some embodiments, the second distance is given by $$Rn = \frac{A}{\sin(\theta + \Phi)};$$

where A is a height of the antenna above the ground, θ is the angle of declination, and φ is an angle between the projection of the maximum antenna gain and the −3 dB near projection. In some embodiments, the third distance is given by $$Rc = \frac{A}{\sin(\theta)},$$

where A is a height of the antenna above the ground, θ is the angle of declination, and φ is an angle between the projection of the maximum antenna gain and the −3 dB near projection According to another aspect, a computer for determining a far projection distance of a beam of an antenna on an airborne station, the antenna projecting the beam downward toward the ground at an angle of declination is provided. The computer is configured to determine the far projection distance, based at least in part on a width of the beam and the angle of declination, the far projection distance being a lesser of: a first distance from the antenna to the ground of a 3 dB far projection; two times a second distance from the antenna to the ground of a 3 dB near projection; and a third distance from the antenna to the ground of a projection of the maximum antenna gain multiplied by the square root of two. The computer is further configured to determine a ground footprint of the beam of the antenna based at least in part on the determined far projection distance. The computer is also configured to cause the antenna to be pointed based at least in part on the determined ground footprint of the beam of the antenna.

According to this aspect, in some embodiments, the far projection distance corresponds to a far projection angle that is based at least in part on the beam width and the angle of declination of the antenna. In some embodiments, the first distance is given by $$Rf = \frac{A}{\sin(\theta - \Phi)};$$

where A is a height of the antenna above the ground, θ is the angle of declination, and φ is an angle between the projection of the maximum antenna gain and the −3 dB near projection. In some embodiments, an angle, α, of the far projection distance is based at least in part on at least one of the angle of declination, θ, and the angle φ. In some embodiments, the angle α is selected from a lookup table based at least in part on at least the angle of declination, θ, and the beam width. In some embodiments, the second distance is given by $$Rn = \frac{A}{\sin(\theta + \Phi)};$$

where A is a height of the antenna above the ground, θ is the angle of declination, and φ is an angle between the projection of the maximum antenna gain and the −3 dB near projection. In some embodiments, the third distance is given by $$Rc = \frac{A}{\sin(\theta)},$$

where A is a height of the antenna above the ground, θ is the angle of declination, and φ is an angle between the projection of the maximum antenna gain and the −3 dB near projection.

According to yet another aspect, a method for determining a ground coverage footprint of a beam of an antenna mounted above the ground and projecting the beam downward toward the ground at an angle of declination is provided. The method includes receiving a beam width and the angle of declination of the antenna. The method also includes determining a far projection distance based at least in part on the beam width and the angle of declination, the far projection distance defining the ground coverage footprint of the beam. The far projection distance is a lesser of a first distance to the ground from the antenna, the first distance corresponding to a −3 dB far projection; twice a second distance to the ground from the antenna, the second distance corresponding to a −3 dB near projection; and a third distance to the ground of a projection of a maximum antenna gain multiplied by the square root of two. The method also includes determining a ground footprint of the beam of the antenna based at least in part on the determined far projection distance. The method further includes causing the antenna to be pointed based at least in part on the determined ground footprint of the beam of the antenna.

According to this aspect, in some embodiments, the first distance is given by $$Rf = \frac{A}{\sin(\theta - \Phi)};$$

the second distance is given by $$Rn = \frac{A}{\sin(\theta + \Phi)};$$

and the third distance is given by $$Rc = \frac{A}{\sin(\theta)},$$

where A is a height of the antenna above the ground, θ is the angle of declination, and φ is an angle between the projection of the maximum antenna gain and the −3 dB near projection.

In some embodiments, an angle, α, of the far projection distance is determined based at least in part on at least one of the angle of declination, θ, and the angle φ. In some embodiments, an angle α of the far projection distance is given by one of the following:

IF 0>=θ<=$A$ TAN[(√2−cos Φ)/sin Φ],

THEN α=$A$ SIN[sin(θ+Φ)/2];

IF $A$ TAN[(√2−cos Φ)/sin Φ]>θ<=$A$ TAN[sin Φ/(1/√2−cos Φ)]

THEN α=$A$ SIN[sin(θ)/√2]; and

IF $A$ TAN [sin Φ/(1/√2−cos Φ)]>θ<=90

THEN α=$A$ SIN[sin(θ−Φ)].

In some embodiments, the angle α is selected from a lookup table based at least in part on at least the angle of declination, θ, and the beam width. In some embodiments, the lookup table selection is further based at least in part on angle φ.

BRIEF DESCRIPTION OF THE DRAWINGS

A more complete understanding of the embodiments discussed herein, and the attendant advantages and features thereof, will be more readily understood by reference to the following detailed description when considered in conjunction with the accompanying drawings wherein:

FIG. 9 displays TABLE 2 which provides the calculated values for the far projection angle α for antenna tilt angles θ, from 0 to 90 degrees and for a selection of half beam widths, BW/2, Φ;

FIG. 13 is a flowchart of an exemplary method for determining a ground coverage footprint of a beam of an antenna mounted above the ground and projecting the beam downward toward the ground at an angle of declination.

DETAILED DESCRIPTION

This disclosure relates to the ground projection for the coverage of an airborne directional antenna.

Figure 1:
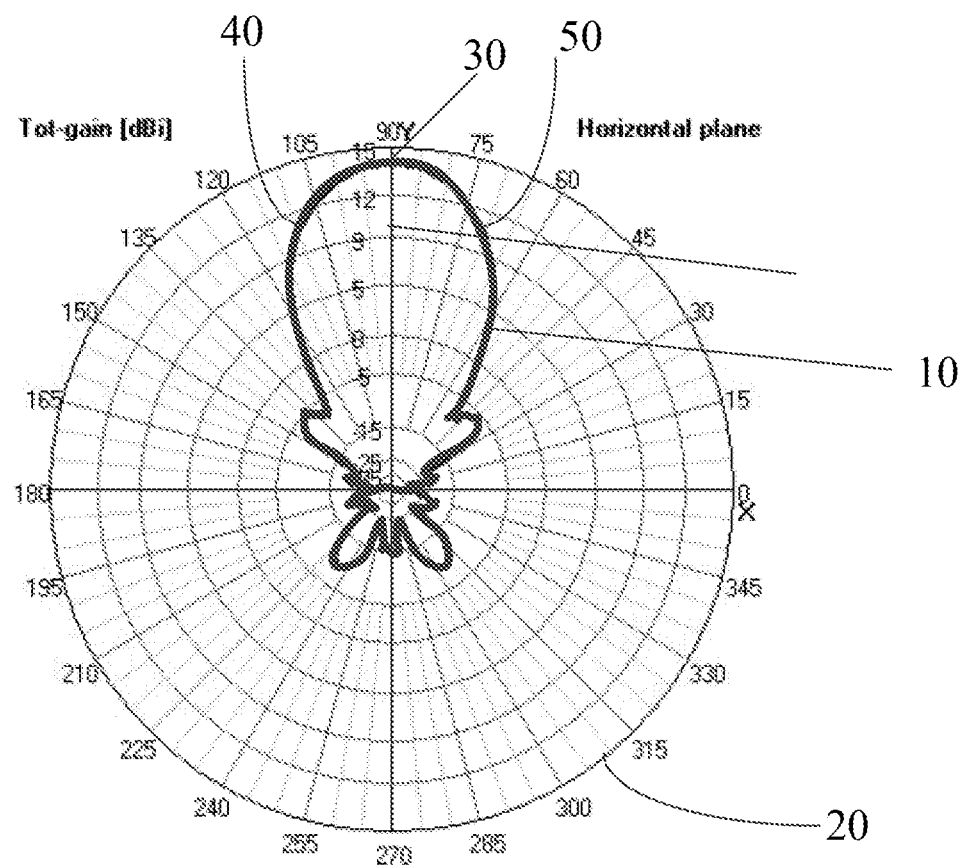
FIG. 1 is an exemplar plot of the gain of a typical directional antenna.
Figure 2:
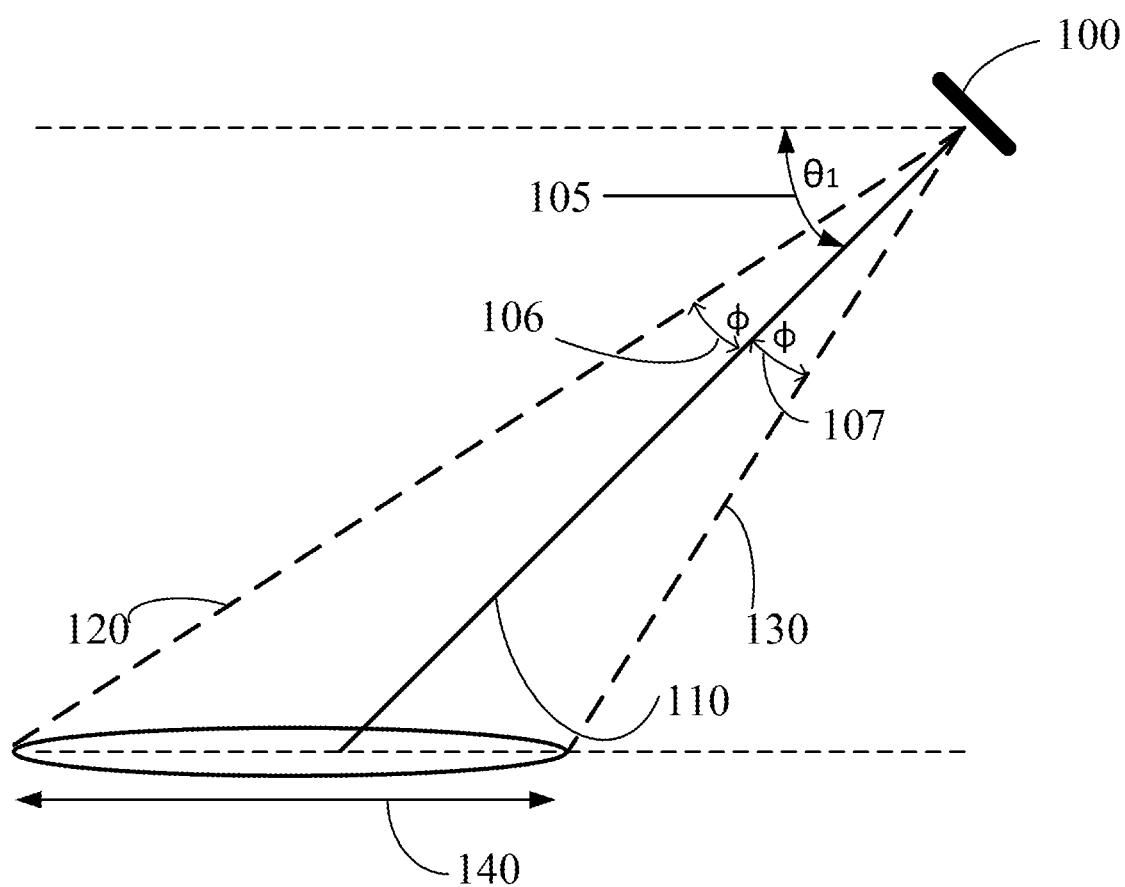
FIG. 2 is a diagrammatical representation of a directional antenna positioned above the earth's surface showing the effective antenna projection on the ground, i.e., the earth's surface.
Figure 3:
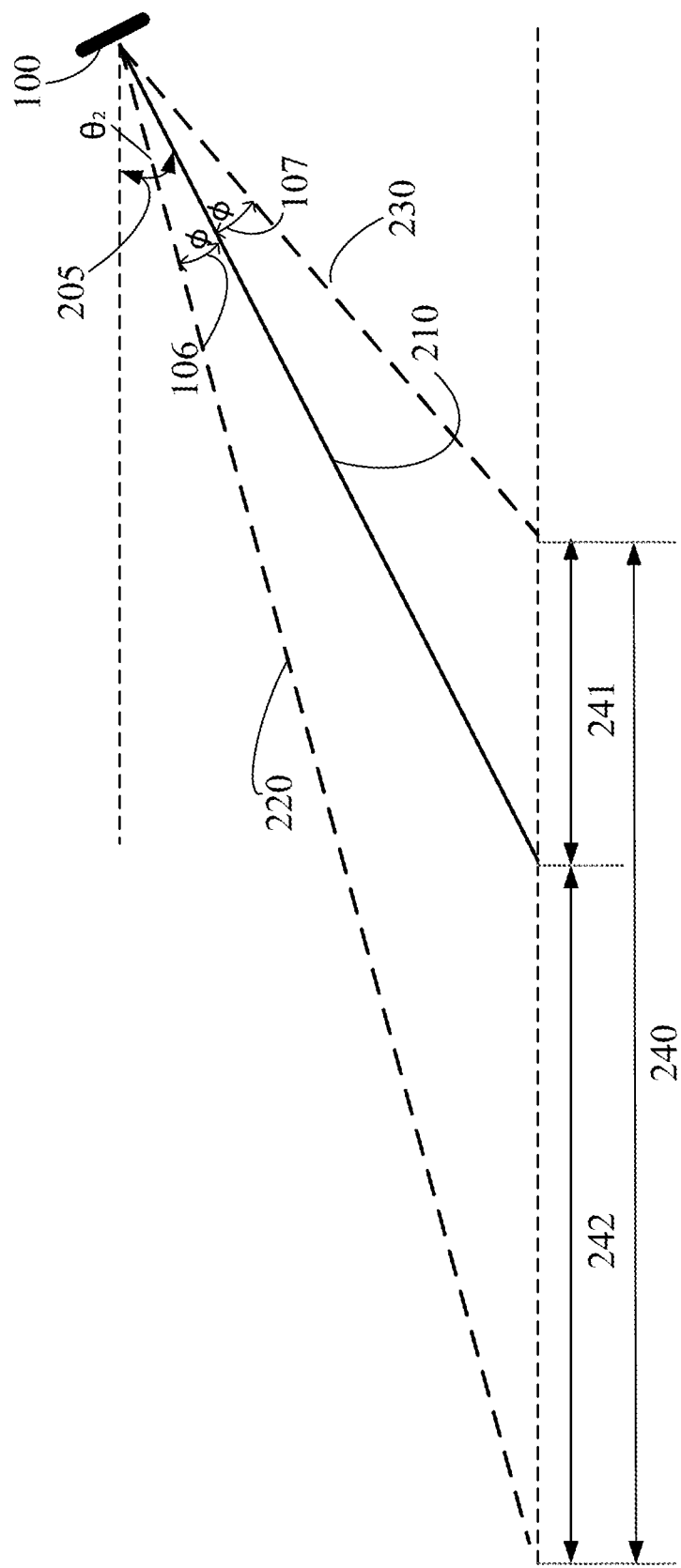
FIG. 3 is a diagrammatical representation of a directional antenna positioned above the earth's surface at a smaller tilt angle than shown in FIG. 1.
Figure 4:
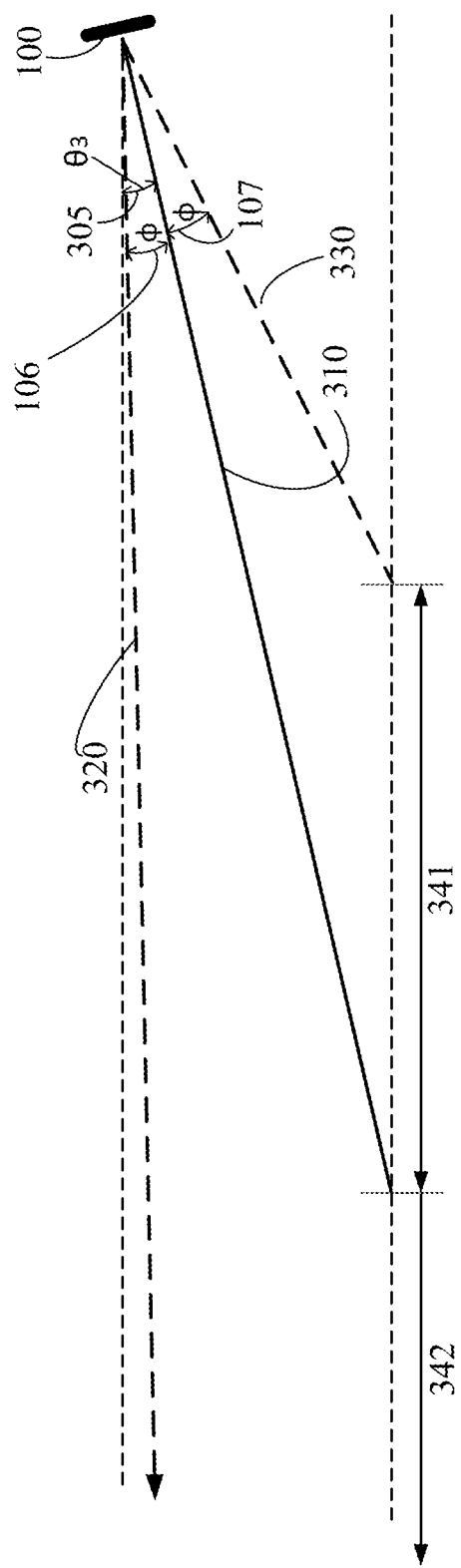
FIG. 4 is a diagrammatical representation of a directional antenna positioned above the earth's surface at a tilt angle that approaches the value of half the beam width.

To overcome the problem of the −3 dB far projection resulting in an oversized ground projection, as discussed in FIG. 4, a method and system is disclosed where the ground projection of the effective gain of an airborne directional antenna is determined, e.g., calculated, such that the far ground projection is not over-large due to small antenna tilt angles and an angle of the far projection is determined based upon the distance from the antenna to the ground of the −3 dB near projection and the distance from the antenna to the ground of the maximum antenna gain projection.

The propagation of the wireless signals to and from the directional antenna 100 can be assumed to be free space and as such, the propagation loss is proportional to the square of the distance, or 6 dB per octave. Hence, doubling the distance results in a 6 dB loss, and multiplying the distance by the square root of 2 results in a 3 dB loss. Based upon these two criteria the effective far projection is determined such that the distance of the far projection to the ground is calculated to be either:

a) the distance to the ground of the −3 dB far projection or, b) 2 times the distance to the ground of the −3 dB near projection, or, c) the distance to the ground of the projection of the maximum antenna gain multiplied by the square root of 2, whichever is the least.

Figure 5:
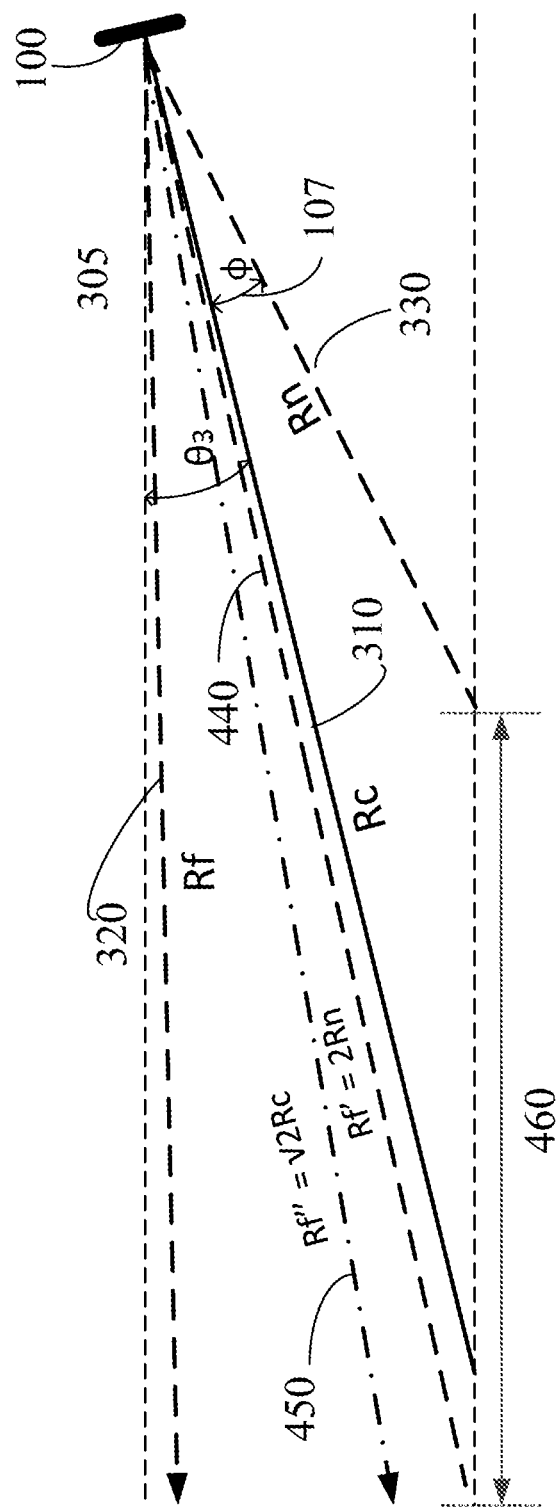
FIG. 5 is the representation of a directional antenna positioned above the earth's surface at a tilt angle that approaches the value of half the beam width, as shown in FIG. 4.

FIG. 5 is the representation of a directional antenna 100 positioned above the earth's surface at a tilt angle θ₃ 305 where θ₃ 305 approaches the value of half the beam width, Φ, as also shown in FIG. 4. As previously discussed in FIG. 4, the −3 dB far projection 320 is very long and the resulting ground distance 342 is a very long distance. The distance Rn is the range of the −3 dB near projection 330 from the directional antenna 100 to the ground. The distance Rc is the range of the maximum antenna gain projection 310 from the directional antenna 100 to the ground. Projection Rf' 440 is where the distance from the directional antenna 100 to the ground is equal to 2Rn. Projection Rf" 450 is where the distance from the directional antenna 100 to the ground is equal to √2Rc. In this example, projection Rf' 440 (Rf'=2Rn) is less than projection Rf" 450 (Rf"=√2Rc), indicating that setting the effective −3 dB far projection to be 6 dB down on the −3 dB near projection rather than 3 dB down on the maximum gain projection results in the smaller ground distance 460. The effective antenna ground footprint is now practical and useful.

Figure 6:
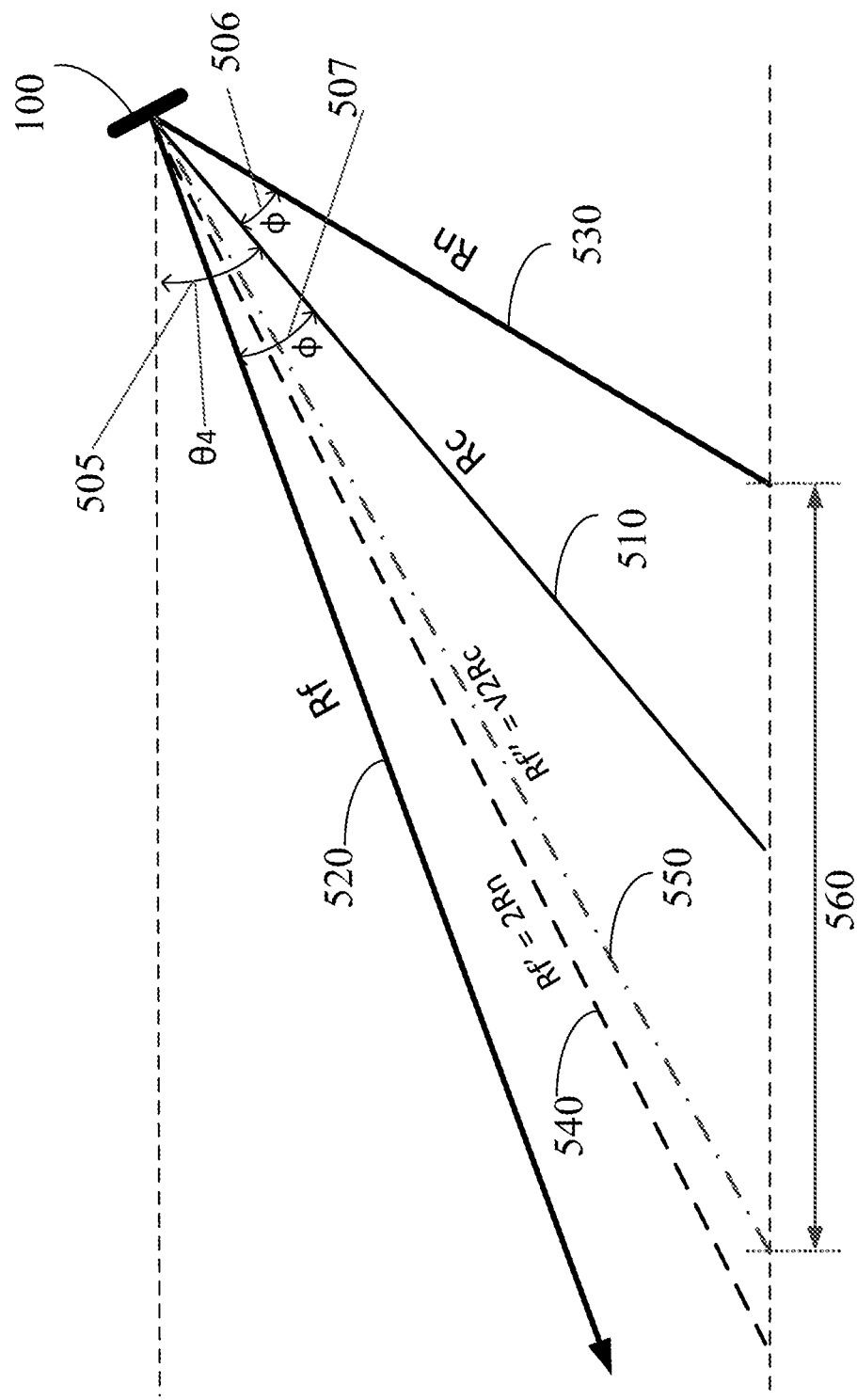
FIG. 6 is a diagrammatical representation of a directional antenna positioned above the earth's surface at a tilt angle of about 40 degrees and a 3 dB beam width of about +/−20 degrees.

FIG. 6 is a diagrammatical representation of a directional antenna 100 positioned above the earth's surface at a tilt angle $\theta_4$ 505, where $\theta_4$ 505 is about 40 degrees. Directional antenna 100 has a 3 dB beam width of 2Φ, 506 and 507 of about +/−20 degrees. Rn is the distance from the directional antenna 100 to the ground of the −3 dB near projection 530, Rc is the distance from the directional antenna 100 to the ground of the maximum antenna gain projection 510 and Rf is the distance from the directional antenna 100 to the ground of the −3 dB far projection 520. Similar to the condition shown in FIG. 5 using the −3 dB far projection would result in a very large extended antenna ground footprint. Projection Rf' 540 is where the distance from the directional antenna 100 to the ground is equal to 2Rn and projection Rf" 550 is where the distance from the directional antenna 100 to the ground is equal to √2Rc. In this example, the smaller footprint 560 results if Rf" 550 is used rather than projection Rf' 540 or indeed, the −3 dB far projection Rf 520.

As shown in FIGS. 3, 4, 5 and 6, as the tilt angle θ of the directional antenna 100 varies, using the −3 dB far projection to show an antenna ground footprint progressively results in larger and larger footprints as the value of the tilt angle θ approaches the value of half the beam width Φ. These footprints do not then provide a meaningful representation of the antenna gain on the ground. By setting the far projection such that the distance from the directional antenna 100 to the ground is twice the distance of the −3 dB near projection from the directional antenna 100 to the ground, the far point of the antenna ground footprint will represent an antenna gain −6 dB compared to the near point of the footprint. Furthermore, by setting the far projection such that the distance from the directional antenna 100 to the ground is √2 times the distance of the −3 dB maximum antenna gain projection from the directional antenna 100 to the ground, the far point of the antenna ground footprint will represent an antenna gain −3 dB compared to the maximum antenna gain of the directional antenna 100. As the value of the tilt angle θ varies from 0 to 90 degrees, by selecting the far projection based upon the smallest value of Rf, √2Rc and 2Rn the antenna ground footprint is meaningful.

Figure 7:
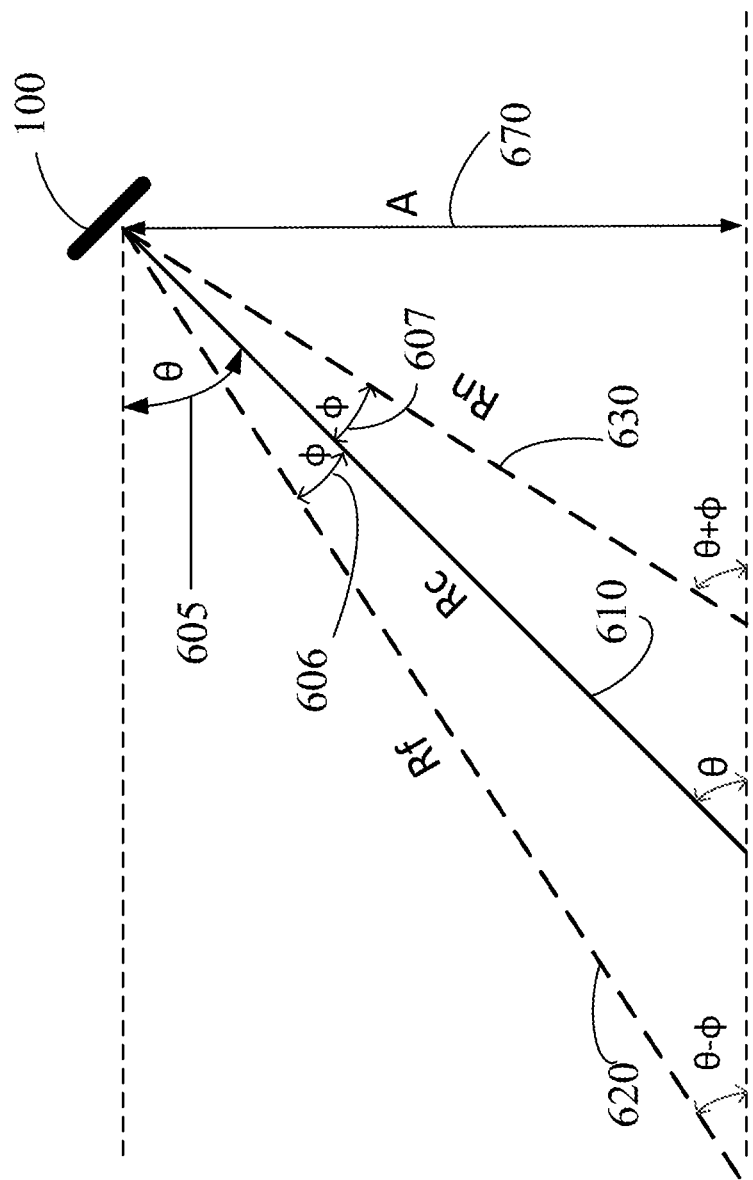
FIG. 7 is a general diagrammatical representation of a directional antenna positioned at a height above the earth's surface.

FIG. 7 is a general diagrammatical representation of a directional antenna 100 positioned a height of A 670 above the earth's surface. The directional antenna 100 is positioned at a tilt angle θ 605 and the projection 610 represents the direction of maximum gain at the tilt angle θ 605. The directional antenna 100 has a beam width of 2Φ, 606 and 607, therefore the −3 dB far projection 620 is at a tilt angle of ($\theta_1$−Φ) and the −3 dB near projection 630 is at a tilt angle of ($\theta_1$+Φ). Rn is the distance from the directional antenna 100 to the ground of the −3 dB near projection 630, Rc is the distance from the directional antenna 100 to the ground of the maximum antenna gain projection 610 and Rf is the distance from the directional antenna 100 to the ground of the −3 dB far projection 620. Using simple trigonometry, the following expressions for Rn, 630, Rc 610 and Rf 620 can be derived:

$$Rn = \frac{A}{\sin(\theta + \Phi)} \quad (1)$$

$$Rc = \frac{A}{\sin(\theta)} \quad (2)$$

$$Rf = \frac{A}{\sin(\theta - \Phi)} \quad (3)$$

As shown in FIGS. 5 and 6 as the tilt angle θ increases from 0 degrees, the effective far projection will first be based upon Rf'=2 Rn, but as the tilt angle further increases the effective far projection will then be based upon Rf"=√2 Rc. At the higher tilt angles the −3 dB far projection Rf will be used.

Hence the first criteria for selecting the effective far projections is to determine the tilt angles when 2 Rn<√2 Rc.

$$2Rn < \sqrt{2}Rc \text{ Hence,} \quad (4)$$

from (1) and (2) $\frac{2A}{\sin(\theta+\Phi)} < \frac{\sqrt{2}A}{\sin(\theta)}$ Rearranging, $2\sin(\theta) < \sqrt{2}\sin(\theta + \Phi)$ Expanding $\sqrt{2}\sin\theta < \sin\theta\cos\Phi + \cos\theta\sin\Phi$ $\sqrt{2} < \cos\Phi + \sin\Phi/\tan\theta$ $$\tan\theta < (\sqrt{2} - \cos\Phi)/\sin\Phi \quad (5)$$

The second criteria for selecting the effective far projections is to determine the tilt angles when √2 Rc<Rf $$\sqrt{2}Rc < Rf \text{ Hence,} \quad (6)$$

from (2) and (3) $\frac{\sqrt{2}A}{\sin(\theta)} < \frac{A}{\sin(\theta-\Phi)}$ Rearranging, $\sqrt{2}\sin(\theta - \Phi) < \sin(\theta)$ Expanding $\sqrt{2}(\sin\theta\cos\Phi - \cos\theta\sin\Phi) < \sin\theta$ $\cos\Phi - \sin\Phi/\tan\theta < 1/\sqrt{2}$ $$\tan\theta < \sin\Phi/(1/\sqrt{2}\cos\Phi) \quad (7)$$

Therefore, for tilt angle θ varying from 90 degrees to zero, the effective far projection $Rf_{eff}$ is determined as follows:

IF $0 \geq \theta \leq A$ TAN[(√2−cos Φ)/sin Φ]

THEN $Rf_{eff}$=2Rn

IF $A$ TAN[(√2−cos Φ)/sin Φ]>θ<=$A$ TAN[sin Φ/(1/√2−cos Φ)]

THEN $Rf_{eff}$=2Rc

IF $A$ TAN[sin Φ/(1/√2−cos Φ)]>θ<=90

THEN $Rf_{eff}$=Rf

The calculated values for the two criteria as per equations (5) and (7) for example values of Φ are shown in Table 1. The values for the tilt angle are dependent upon the half beam width Φ of the directional antenna.

TABLE 1

| BW/2, degrees, Φ | 10 | 20 | 25 | 30 | 35 | 40 | 45 |
|---|---|---|---|---|---|---|---|
| Criteria 1 (2Rn < √2Rc), θ | 22 | 35.8 | 39.8 | 42.4 | 43.9 | 44.8 | 45 |
| Criteria 2 (√2Rc < Rf), θ | 32 | 55.8 | 64.8 | 72.4 | 78.9 | 84.8 | 90 |

Figure 8:
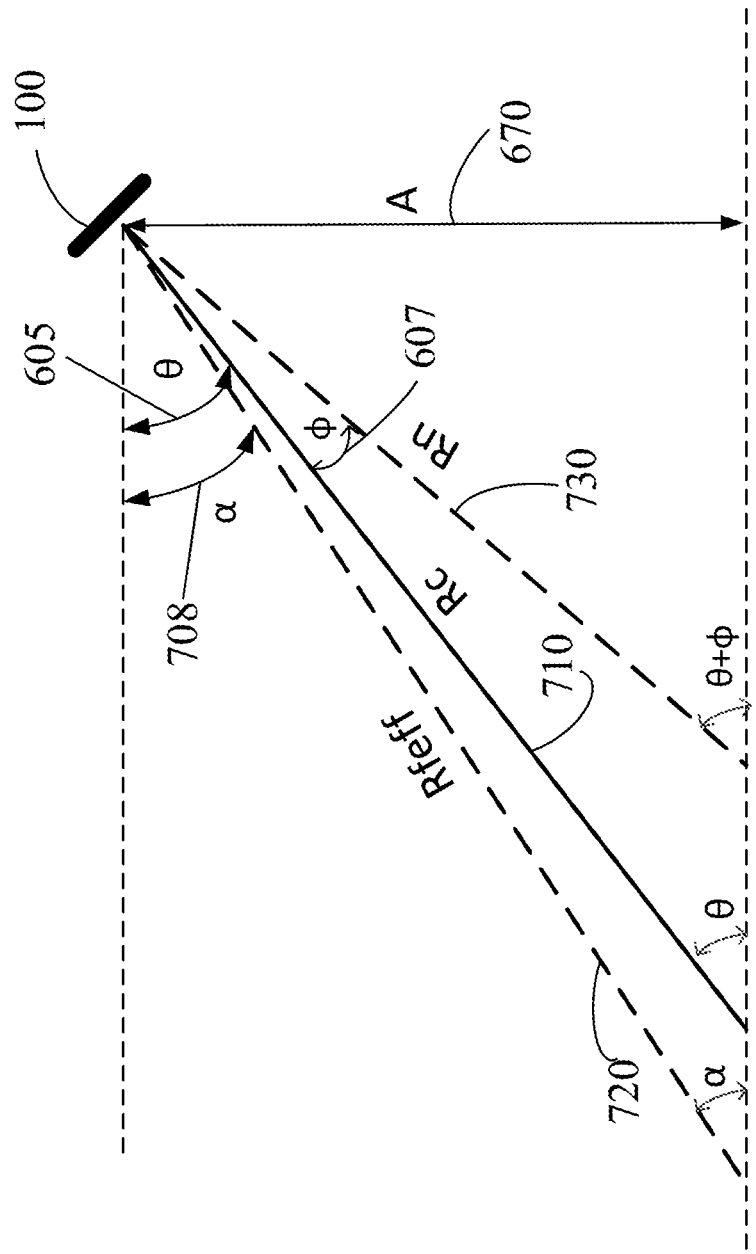
FIG. 8 is a general diagrammatical representation of a directional antenna positioned at a height above the earth's surface similar to FIG. 7.

Hence, from Table 1, in this example, for a directional antenna with beam width +/−10 degrees, $Rf_{\mathit{eff}}=2Rn$ for $0>=\theta<=22$ And $Rf_{\mathit{eff}}=\sqrt{2}Rc$ for $22>\theta<=32$ And $Rf_{\mathit{eff}}=Rf$ for $32>\theta<=90$ FIG. 8 is a general diagrammatical representation of a directional antenna 100 positioned a height of A 670 above the earth's surface similar to FIG. 7. The directional antenna 100 is positioned at a tilt angle θ 605 and the maximum antenna gain projection 610 represents the direction of maximum gain at the tilt angle θ 605. $Rf_{\mathit{eff}}$ is the distance from the directional antenna 100 to the ground of the far projection 720 which may be calculated as described above. The far projection 720 is at an angle α 708 below the horizontal. It is of interest to calculate the value for angle α 708 for a given tilt angle θ 605 and half beam width Φ 607 so as to simplify the antenna ground footprint determination. Knowing the values of θ 605, Φ 607 and α 708, the ground antenna footprint may be plotted.

Using trigonometry, $Rf_{\mathit{eff}}=A/\sin\alpha$,
Using expressions (1), (2) and (3):

For $Rf_{\mathit{eff}}=2Rn$, then $\sin\alpha=A/2Rn=\sin(\theta+\Phi)/2$

For $Rf_{\mathit{eff}}=\sqrt{2}Rc$, then $\sin\alpha=A/\sqrt{2}Rc=\sin(\theta)/\sqrt{2}$ For $Rf_{\mathit{eff}}=Rf$, then $\sin\alpha=A/Rf=\sin(\theta-\Phi)$ Therefore, for tilt angle θ varying from 90 degrees to zero, the angle α of the effective far projection $Rf_{\mathit{eff}}$ is determined as follows:

IF $0>=\theta<=A\ \mathrm{TAN}[(\sqrt{2}-\cos\Phi)/\sin\Phi]$

THEN $\alpha=A\ \mathrm{SIN}[\sin(\theta+\Phi)/2]$ (8)

IF $A\ \mathrm{TAN}[(\sqrt{2}-\cos\Phi)/\sin\Phi]>\theta<=A\ \mathrm{TAN}[\sin\Phi/(1/\sqrt{2}-\cos\Phi)]$ THEN $\alpha=A\ \mathrm{SIN}[\sin(\theta)/\sqrt{2}]$ (9)

IF $A\ \mathrm{TAN}[\sin\Phi/(1/\sqrt{2}-\cos\Phi)]>\theta<=90$

THEN $\alpha=A\ \mathrm{SIN}[\sin(\theta-\Phi)]$ (10)

FIG. 9 displays TABLE 2 800 which provides the calculated values for the angle α for antenna tilt angles θ, from 0 to 90 degrees and for a selection of half beam widths, BW/2 Φ, using the formulas derived above. For example, for a directional antenna 100, with a half beam width Φ of 20 degrees, mounted at a tilt angle θ of 15 degrees, the far projection will be at an angle of 16.7 degrees. Note that in this case the −3 dB far projection would be at an angle of −5 degrees ((θ−Φ)=(15−20)=−5), i.e., 5 degrees above the horizontal, where the −3 dB far projection would never actually reach the ground.

Figure 10:
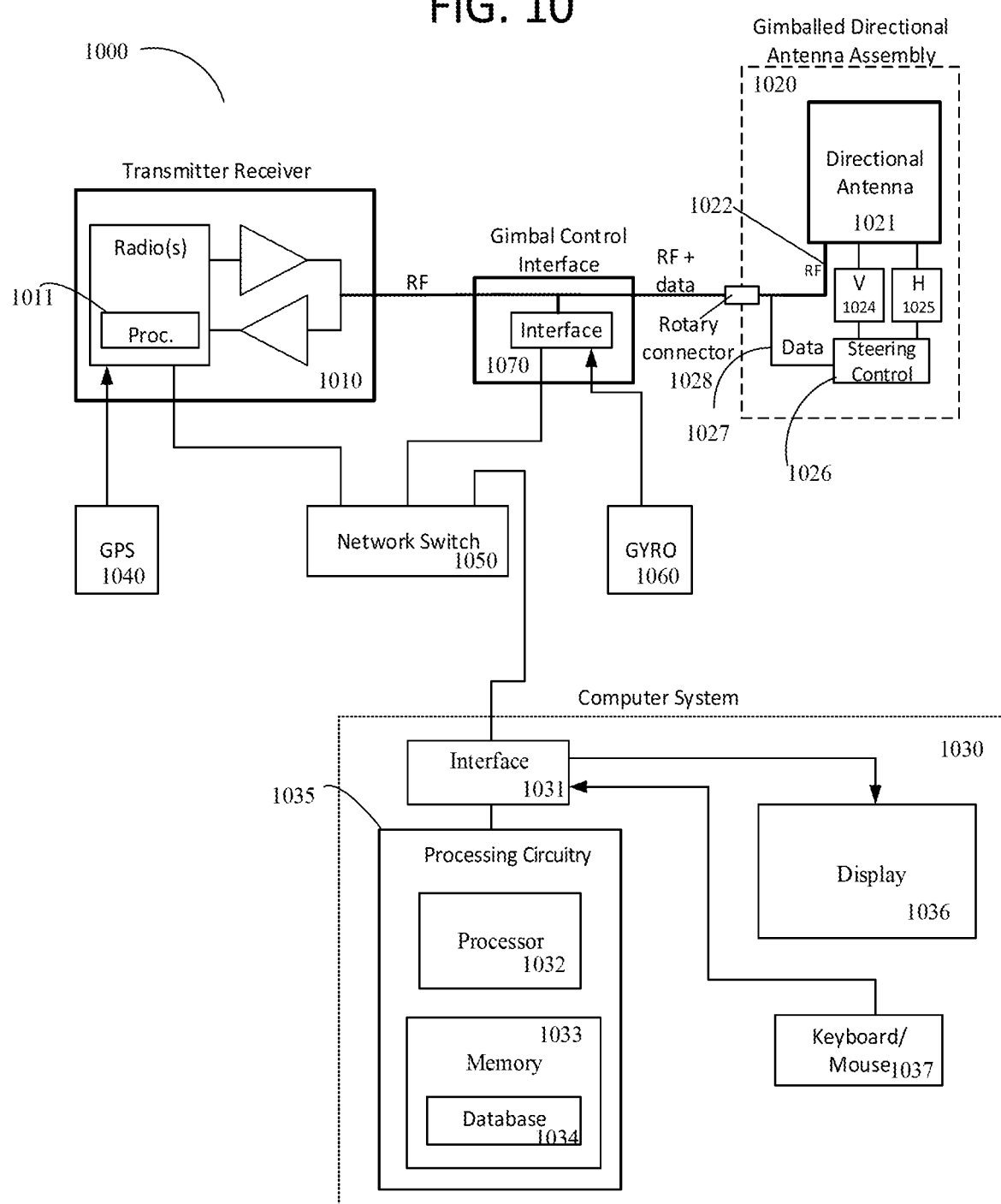
FIG. 10 is a block diagram of an example airborne system employing a gimballed directional antenna that is used in accordance with the principles set forth herein.

FIG. 10 is a block diagram of an example airborne system 1000 employing a gimballed directional antenna 1021 that is used in accordance with the principles described herein. In one embodiment, system 1000 may include a gimballed directional antenna assembly 1021, a transmitter receiver 1010, a gimbal control interface module 1070, a computer system 1030, a global positioning system (GPS) module 1040, a gyro module 1060 and a network switch 1050 such as an Ethernet switch.

A directional antenna 1021 may be part of the gimballed antenna assembly 1020 which may also include a steering control module 1026 which may operate two motors 1024 and 1025 that control the vertical and horizontal orientations of the directional antenna 1021 respectively. The transmitter receiver 1010 may transmit or receive radio frequency (RF) signals to and from the directional antenna 1021. The RF signal from the Transmitter Receiver 1010 may be connected to the gimbal control interface module 1070. The gyro module 1060 may provide yaw, tilt and roll information of the airborne platform and the gyro module output may be inputted to the gimbal control interface module 1070. The GPS module 1040 output may be connected to the transmitter receiver 1010. The GPS module 1040 may provide the latitude, longitude and elevation of the airborne platform. The transmitter receiver 1010 may append GPS information to any RF transmission. The network switch 1050 may be connected to the transmitter receiver 1010, the computer system 1030 and the gimbal control interface 1070.

The gimbal control interface module may take data via the network switch 1050 and data from the gyro module 1060 and convert the data to a single data stream which is added to the RF signal to or from the transmitter receiver 1010. The combined RF and data stream may then be connected to the gimballed directional antenna assembly 1020 via a rotary connector 1028. The data 1027 may be filtered from the RF signal 1022 and connected to the steering control module 1026 and used to control the vertical and horizontal position of the directional antenna 1021. Information on the tilt angle of the directional antenna 1021 may be fed back to the gimbal control interface module 1070 where the information may be converted into data such as Ethernet data and applied to the network switch 1050.

The transmitter receiver 1010 may include a processor 1011. The GPS information may be provided to the processor 1011 by the GPS module 1040. RF receptions may have the GPS information added such that the position of the airborne platform is known for each received signal. The transmitter receiver 1010 may include more than one radio and therefor any transmission may be automatically received by another radio within the Transmitter Receiver and by this means, the airborne platform position is also known for each transmission. The GPS information may be sent to the network switch 1050 and therefore made available to the computer system 1030.

The computer system 1030 may include an interface 1031. The interface 1031 may contain an Ethernet connection to the network switch 1050, the connection to a display 1036, a connection to a keyboard and mouse 1037 as well as interfacing to the processing circuitry 1035. In some embodiments, the processing circuitry 1035 may include a processor 1032, a memory 1033 and a database 1034. The database 1034 may contain the ground mapping information of the area of interest and the processor 1032 and memory 1033 may be used to carry out the exemplary method 900 using information on the position of the airborne platform derived from the GPS module 1040, the gyro module 1060, and beam width information on the directional antenna 1021 which may be inputted using the keyboard and mouse 1037. The tilt angle of the directional antenna 1021 may be provided by the steering control module 1026 via the network switch 1050 and interface 1031. The display 1036 may be used to show the ground map together with the directional antenna ground projection which may be derived using the exemplary method 900. Note that the modules discussed herein may be implemented in hardware or a combination of hardware and software. For example, the modules may be implemented by a processor executing software instructions or by application specific integrated circuitry configured to implement the functions attributable to the modules. Also note that the term "connected to" as used herein refers to "being in communication with" and is not intended to mean a physical connection nor a direct connection. It is contemplated that the signal path between one element and another may traverse multiple physical devices.

Thus, in some embodiments, the processing circuitry 1035 may include the memory 1033 and a processor 1032, the memory 1033 containing instructions which, when executed by the processor 1032, configure the processor 1032 to perform the one or more functions described herein. In addition to a traditional processor and memory, the processing circuitry 1035 may comprise integrated circuitry for processing and/or control, e.g., one or more processors and/or processor cores and/or FPGAs (Field Programmable Gate Array) and/or ASICs (Application Specific Integrated Circuitry).

The processing circuitry 1035 may include and/or be connected to and/or be configured for accessing (e.g., writing to and/or reading from) the memory 1033, which may include any kind of volatile and/or non-volatile memory, e.g., cache and/or buffer memory and/or RAM (Random Access Memory) and/or ROM (Read-Only Memory) and/or optical memory and/or EPROM (Erasable Programmable Read-Only Memory). Such memory 1033 may be configured to store code executable by control circuitry and/or other data, e.g., data pertaining to communication, e.g., configuration and/or address data of nodes, etc. The processing circuitry 1035 may be configured to control any of the methods described herein and/or to cause such methods to be performed, e.g., by the processor 1032. Corresponding instructions may be stored in the memory 1033, which may be readable and/or readably connected to the processing circuitry 1035. In other words, the processing circuitry 1035 may include a controller, which may comprise a microprocessor and/or microcontroller and/or FPGA (Field-Programmable Gate Array) device and/or ASIC (Application Specific Integrated Circuit) device. It may be considered that the processing circuitry 1035 includes or may be connected or connectable to memory, which may be configured to be accessible for reading and/or writing by the controller and/or processing circuitry 1035.

Figure 11:
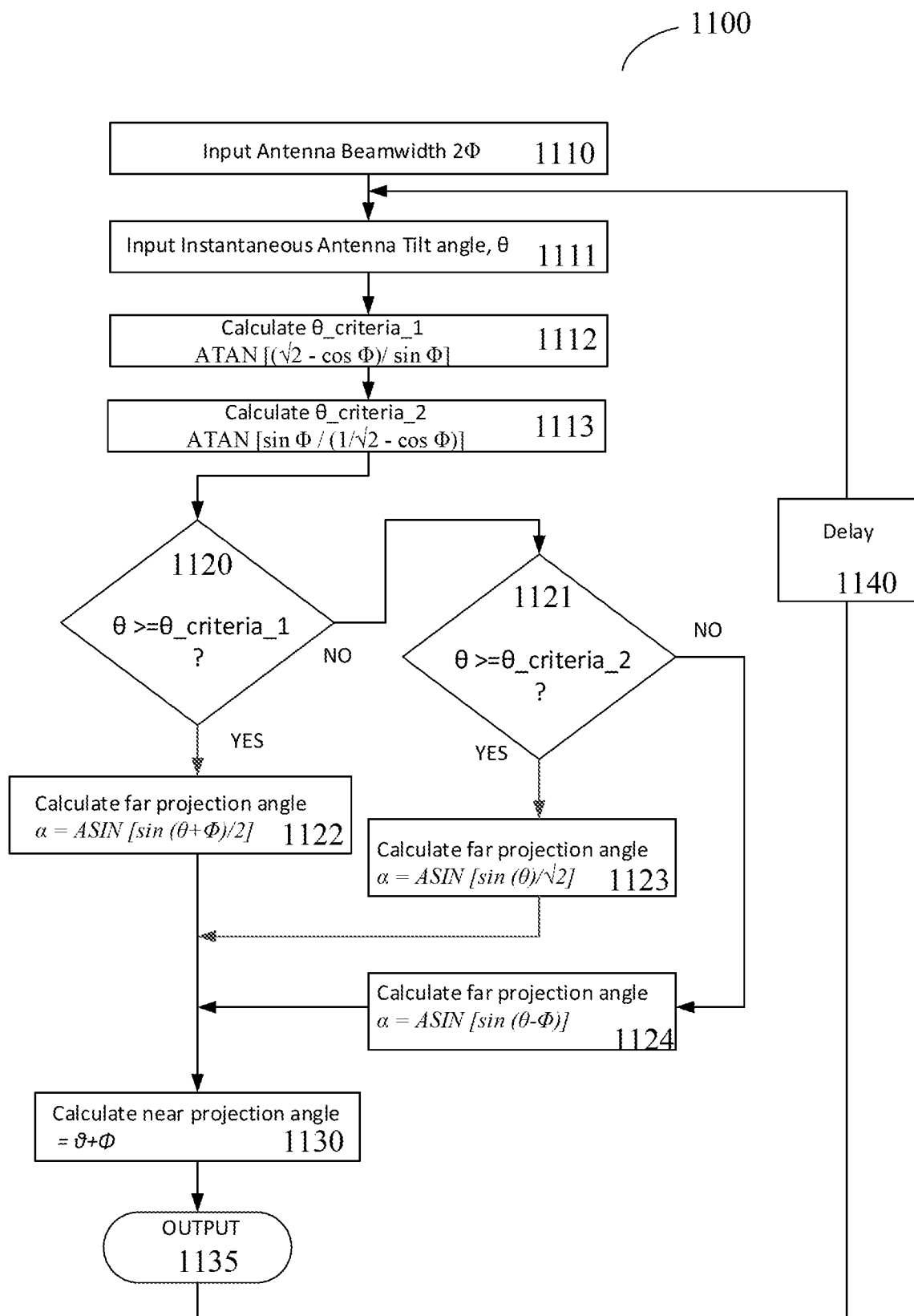
FIG. 11 is a flowchart of an exemplary method for determining a far projection angle according to an embodiment of the disclosure.

FIG. 11 illustrates an exemplary method 1100 according to an embodiment of the disclosure. Method 1100 takes the inputs for the antenna beam width and tilt angle and calculates the angles for the far projection and the near projection. The resultant values may then be used for a display of the antenna footprint on the ground.

Method 1100 may start by step 1110 where the value, 2Φ, of the antenna beam width is inputted. The beam width of an antenna will be a fixed value. Step 1110 may be followed by step 1111 where the value for the antenna tilt angle is inputted. The tilt angle may vary and therefore the tilt value entered will be the instantaneous value. The antenna may be mounted in a gimballed system where the tilt angle may vary continuously or the antenna may be fixed such that the tilt angle is effectively steady. If mounted in an aircraft, subject to tilt and yaw, the movements of the aircraft may affect the tilt angle again in a continuous manner. If the antenna is mounted in an aircraft the tilt angle may be derived by a combination of input from an external device, such as GPS (Global Positioning System) and the aircraft instrumentation or a gyroscope. Methods of deriving the tilt angle of the antenna are well known and do not form part of this disclosure.

Step 1111 may be followed by step 1112 where the first criteria for selecting the effective far projection is determined as previously described in expressions (4) and (5). The value of the first criteria, θ_criteria_1, is calculated using the values for half beam width, Φ, and instantaneous tilt, θ, entered in steps 1110 and 1120 respectively. Step 1112 may be followed by step 1113 where the second criteria for selecting the effective far projection is determined as previously described in expressions (6) and (7). The value of the second criteria, θ_criteria_2, is calculated using the values for half beam width, Φ, and instantaneous tilt, θ, entered in steps 1110 and 1120 respectively. Step 1113 may be followed by step 1120 where the instantaneous tilt angle, θ, inputted in step 1111, is compared to the value of the first criteria, θ_criteria_1, calculated in step 1112. If the instantaneous tilt angle, θ, inputted in step 1111, is greater than or equal to the value of the first criteria, θ_criteria_1, then step 1120 may be followed by step 1122 where the far projection angle, α, is calculated using expression (8). If the instantaneous tilt angle, θ, inputted in step 1111, is less than the value of the first criteria, θ_criteria_1, then step 1120 may be followed by step 1121 where the instantaneous tilt angle, θ, inputted in step 1111, is compared to the value of the second criteria, θ_criteria_2, calculated in step 1113. If the instantaneous tilt angle, θ, inputted in step 1111, is greater than or equal to the value of the second criteria, θ_criteria_1, then step 1120 may be followed by step 1123 where the far projection angle, α, is calculated using expression (9). If the instantaneous tilt angle, θ, inputted in step 1111, is less than the value of the second criteria, θ_criteria_2, then step 1121 may be followed by step 1124 where the far projection angle, α, is calculated using expression (10). Either step 1122 or 1123 or 1124 may be followed by step 1130 where the angle for the near projection, θ+Φ, may be calculated. Step 1130 may be followed by step 1135 where the far and near projection angles may be outputted to other system or systems such that the antenna ground footprint may be displayed. Methods for displaying the antenna ground footprint are well known and do not form part of this disclosure. This disclosure is for the determination of the far projection angle as described herein. After step 1135 the method returns to step 1111 via step 1140 which may insert a delay before the process is repeated.

Figure 12:
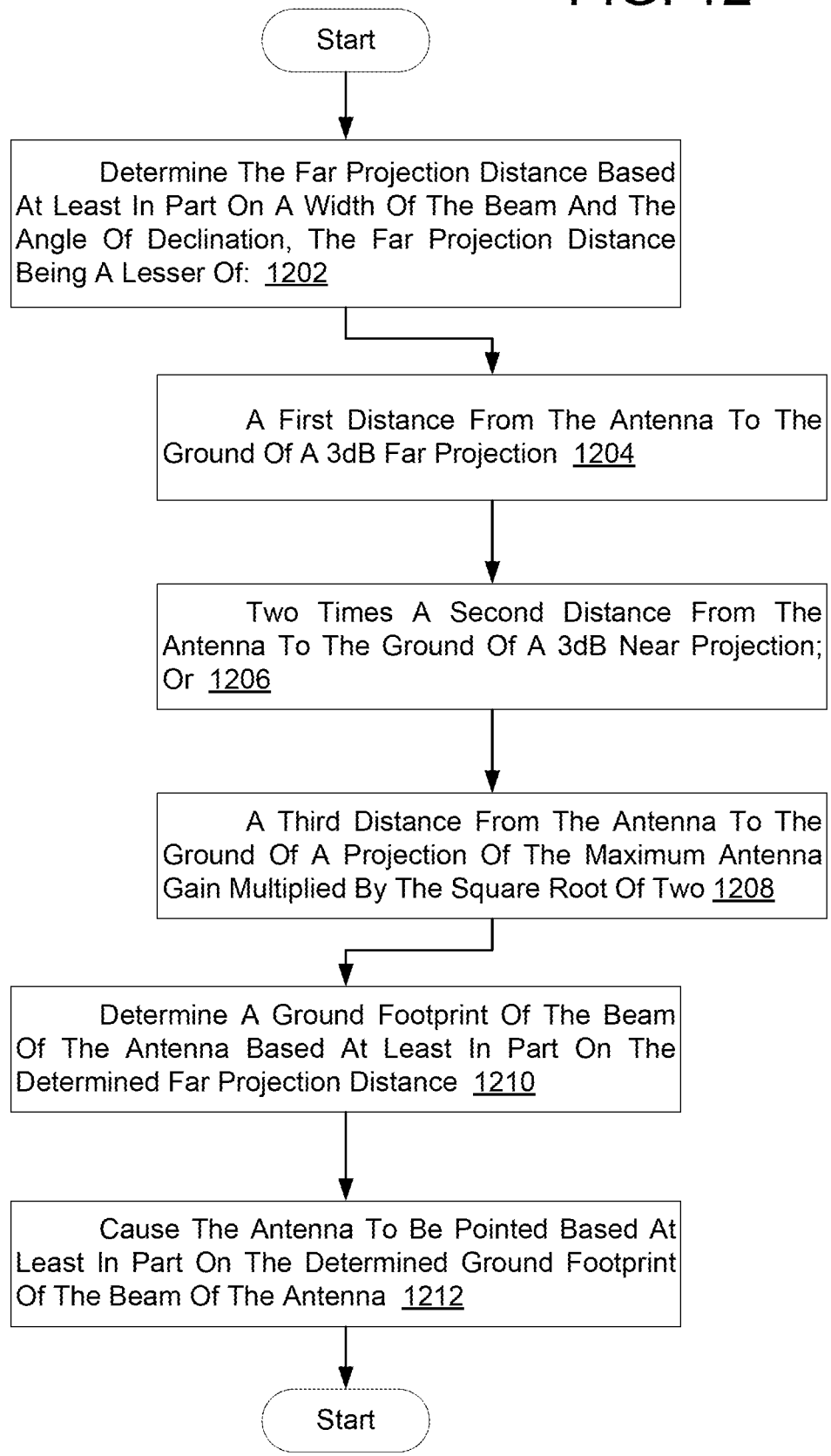
FIG. 12 is a flowchart of another exemplary method for determining a far projection distance of a beam of an antenna on an airborne station, the antenna projecting the beam downward toward the ground at an angle of declination.

FIG. 12 is a flowchart of another exemplary method for determining a far projection distance of a beam of an antenna on an airborne station, the antenna projecting the beam downward toward the ground at an angle of declination. The method includes determining, such as via the processing circuitry 1035, the far projection distance based at least in part on a width of the beam and the angle of declination, the far projection distance being a lesser of (Step 1202): a first distance from the antenna to the ground of a 3 dB far projection (Step 1204); two times a second distance from the antenna to the ground of a 3 dB near projection (Step 1206); and a third distance from the antenna to the ground of a projection of the maximum antenna gain multiplied by the square root of two (Step 1208). The method also includes determining, such as via the processing circuitry 1035, a ground footprint of the beam of the antenna based at least in part on the determined far projection distance (Step 1210). The method further includes causing, such as via processing circuitry 1035 and/or the antenna assembly 1020, the antenna to be pointed based at least in part on the determined ground footprint of the beam of the antenna (Step 1212).

FIG. 13 is a flowchart of an exemplary method for determining a ground coverage footprint of a beam of an antenna mounted above the ground and projecting the beam downward toward the ground at an angle of declination. The method includes receiving, via the keyboard/mouse 1037, for example, a beam width and the angle of declination of the antenna (Step 1300). The method also includes determining, such as via the processing circuitry 1035, a far projection distance based at least in part on the beam width and the angle of declination, the far projection distance defining the ground coverage footprint of the beam, the far projection distance being a lesser of (Step 1302): a first distance to the ground from the antenna, the first distance corresponding to a −3 dB far projection (Step 1304); twice a second distance to the ground from the antenna, the second distance corresponding to a −3 dB near projection (Step 1306); and a third distance to the ground of a projection of a maximum antenna gain multiplied by the square root of two (Step 1308). The method further includes, such as via the processing circuitry 1035, determining a ground footprint of the beam of the antenna based at least in part on the determined far projection distance (Step 1310). The method also includes causing, such as via the processing circuitry 1035 and/or the antenna assembly 1020, the antenna to be pointed based at least in part on the determined ground footprint of the beam of the antenna (Step 1312).

A directional antenna has beam widths in both the horizontal and vertical planes. It is the vertical plane beam width that is of interest to this disclosure as the horizontal beam width does not have near and far components. It should be clear to one moderately skilled in the art that the actual antenna ground footprint is an ellipse derived from the vertical and horizontal projections. The −3 dB near projection and the calculated far projection angle form the values for the vertical axis.

The embodiments are described herein with reference to flowchart illustrations. It will be understood that each block of the flowchart illustrations can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart step or steps.

These computer program instructions may also be stored in a computer readable memory that can direct a computer or other programmable data processing apparatus to function in a particular manner, such that the instructions stored in the computer readable memory produce an article of manufacture including instruction means which implement the function/act specified in the flowchart step or steps.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart step or steps.

It is to be understood that the functions/acts noted in the steps may occur out of the order noted in the operational illustrations. For example, two steps shown in succession may in fact be executed substantially concurrently or the steps may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

While the above description contains many specifics, these should not be construed as limitations on the scope, but rather as an exemplification of several embodiments thereof. Many other variants are possible including, for examples: the beam width of the antenna may be defined based upon relative gain or gains compared the maximum gain other than 3 dB, the beam width may not be symmetrical about the projection of maximum gain. Accordingly, the scope should be determined not by the embodiments illustrated, but by the claims and their legal equivalents.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method for determining a far projection distance of a beam of an antenna on an airborne station, the antenna projecting the beam downward toward the ground at an angle of declination, the method comprising:
determining the far projection distance based at least in part on a width of the beam and the angle of declination, the far projection distance being a lesser of:
a first distance from the antenna to the ground of a far projection corresponding to the width of the beam;
two times a second distance from the antenna to the ground of a near projection corresponding to the width of the beam; and
a third distance from the antenna to the ground of a projection of the maximum antenna gain multiplied by a factor less than 2.

2. The method of claim 1, wherein the factor for determining the third distance from the antenna to the ground is the square root of two.

3. The method of claim 1, wherein the first distance is given by $$Rf = \frac{A}{\sin(\theta - \Phi)};$$

where A is a height of the antenna above the ground, θ is the angle of declination, and φ is an angle between the projection of the maximum antenna gain and the near projection.

4. The method of claim 3, wherein an angle, α, of the far projection distance is based at least in part on at least one of the angle of declination, θ, and the angle φ.

5. The method of claim 4 wherein the angle α is selected from a lookup table based at least in part on at least the angle of declination, θ, and the beam width.

6. The method of claim 1, wherein the second distance is given by $$Rn = \frac{A}{\sin(\theta + \Phi)};$$

where A is a height of the antenna above the ground, θ is the angle of declination, and φ is an angle between the projection of the maximum antenna gain and the near projection.

7. The method of claim 1, wherein the third distance is given by $$Rc = \frac{A}{\sin(\theta)},$$

where A is a height of the antenna above the ground, θ is the angle of declination, and φ is an angle between the projection of the maximum antenna gain and the near projection.

8. The method of claim 1, further comprising determining a ground footprint of the beam of the antenna based at least in part on the determined far projection distance.

9. The method of claim 1, further comprising causing the antenna to be pointed based at least in part on the determined ground footprint of the beam of the antenna.

10. A computer for determining a far projection distance of a beam of an antenna on an airborne station, the antenna projecting the beam downward toward the ground at an angle of declination, the computer configured to:
   determine the far projection distance, based at least in part on a width of the beam and the angle of declination, the far projection distance being a lesser of:
      a first distance from the antenna to the ground of a far projection corresponding to the width of the beam;
      two times a second distance from the antenna to the ground of a near projection corresponding to the width of the beam; and
      a third distance from the antenna to the ground of a projection of the maximum antenna gain multiplied by a factor less than two.

11. The computer of claim 10, wherein the factor for determining the third distance from the antenna to the ground is the square root of two.

12. The computer of claim 10, wherein the first distance is given by $$Rf = \frac{A}{\sin(\theta - \Phi)};$$

where A is a height of the antenna above the ground, θ is the angle of declination, and φ is an angle between the projection of the maximum antenna gain and the near projection.

13. The computer of claim 12, wherein an angle, α, of the far projection distance is based at least in part on at least one of the angle of declination, θ, and the angle φ.

14. The computer of claim 13, wherein the angle α is selected from a lookup table based at least in part on at least the angle of declination, θ, and the beam width.

15. The computer of claim 10, wherein the second distance is given by $$Rn = \frac{A}{\sin(\theta + \Phi)};$$

where A is a height of the antenna above the ground, θ is the angle of declination, and φ is an angle between the projection of the maximum antenna gain and the near projection.

16. The computer of claim 10, wherein the third distance is given by $$Rc = \frac{A}{\sin(\theta)},$$

where A is a height of the antenna above the ground, θ is the angle of declination, and φ is an angle between the projection of the maximum antenna gain and the near projection.

17. The computer of claim 10, where the computer is further configured to determine a ground footprint of the beam of the antenna based at least in part on the determined far projection distance.

18. The computer of claim 10, where computer is further configured to cause the antenna to be pointed based at least in part on the determined ground footprint of the beam of the antenna.

19. A method for determining a ground coverage footprint of a beam of an antenna mounted above the ground and projecting the beam downward toward the ground at an angle of declination, the method comprising:
   receiving a beam width and the angle of declination of the antenna; and
   determining a far projection distance based at least in part on the beam width and the angle of declination, the far projection distance defining the ground coverage footprint of the beam, the far projection distance being a lesser of:
      a first distance to the ground from the antenna, the first distance corresponding to a far projection corresponding to the width of the beam;
      twice a second distance to the ground from the antenna, the second distance corresponding to a near projection corresponding to the width of the beam; and
      a third distance to the ground of a projection of a maximum antenna gain multiplied by a factor less than two;
   determining the ground coverage footprint of the beam of the antenna based at least in part on the determined far projection distance.

20. The method of claim 19, wherein:
   the first distance is given by $$Rf = \frac{A}{\sin(\theta - \Phi)};$$

the second distance is given by $$Rn = \frac{A}{\sin(\theta + \Phi)};$$

and
the third distance is given by $$Rc = \frac{A}{\sin(\theta)},$$

where A is a height of the antenna above the ground, $\theta$ is the angle of declination, and $\phi$ is an angle between the projection of the maximum antenna gain and the near projection.

\* \* \* \* \*